(12) United States Patent
Nakata et al.

(10) Patent No.: US 9,224,766 B2
(45) Date of Patent: Dec. 29, 2015

(54) IMAGE PICKUP APPARATUS CAPABLE OF CONTROLLING EXPOSURE DURING MOTION WITH HIGH SHUTTER SPEED, INCLUDING AMPLIFICATION OF A SIGNAL OBTAINED AS A RESULT OF ACCUMULATING ELECTRIC CHARGE, CONTROL METHOD THEREFOR, AND STORAGE MEDIUM

(71) Applicant: CANON KABUSHIKI KAISHA, Tokyo (JP)

(72) Inventors: Takamichi Nakata, Kawasaki (JP); Seiya Ohta, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 140 days.

(21) Appl. No.: 13/742,555

(22) Filed: Jan. 16, 2013

(65) Prior Publication Data

US 2013/0193309 A1    Aug. 1, 2013

(30) Foreign Application Priority Data

Jan. 30, 2012   (JP) .................................. 2012-016617

(51) Int. Cl.
*H03G 3/20* (2006.01)
*H01L 27/146* (2006.01)
*H04N 5/235* (2006.01)

(52) U.S. Cl.
CPC ........ *H01L 27/14601* (2013.01); *H04N 5/2352* (2013.01); *H04N 5/2353* (2013.01)

(58) Field of Classification Search
CPC ........... H01L 27/14601; H04N 5/2353; H04N 5/2352

USPC .................................................... 250/214 AG
See application file for complete search history.

(56) References Cited

U.S. PATENT DOCUMENTS

| 8,013,930 B2 * | 9/2011 | Tengeiji et al. ............... 348/360 |
| 2009/0161913 A1 * | 6/2009 | Son .............................. 382/105 |

FOREIGN PATENT DOCUMENTS

| JP | 09-055878 A | 2/1997 |
| JP | 3861711 B2 | 12/2006 |
| JP | 2011-044872 | * 3/2011 |

* cited by examiner

*Primary Examiner* — Thanh Luu
(74) *Attorney, Agent, or Firm* — Rossi, Kimms & McDowell LLP

(57) ABSTRACT

An image pickup apparatus which is capable of suppressing changes in luminance during motion with high shutter speed while minimizing image degradation. An image pickup device accumulates electric charge corresponding to an amount of light incident thereon. An amplification unit amplifies a signal obtained as a result of accumulating electric charge in the image pickup apparatus. A control unit controls an electric charge accumulation time period in the image pickup device. An adjustment unit adjusts an amplification factor for the amplification unit. In a case where the control unit changes the electric charge accumulation time period while the image pickup device is repeatedly accumulating electric charge, the adjustment unit adjusts an amplification factor in accordance with the amount of change in the electric charge accumulation time period, and after adjustment, the adjustment unit brings the adjusted amplification factor close to an amplification factor before adjustment in steps.

9 Claims, 6 Drawing Sheets

IMAGE PICKUP APPARATUS CAPABLE OF CONTROLLING EXPOSURE DURING MOTION WITH HIGH SHUTTER SPEED, INCLUDING AMPLIFICATION OF A SIGNAL OBTAINED AS A RESULT OF ACCUMULATING ELECTRIC CHARGE, CONTROL METHOD THEREFOR, AND STORAGE MEDIUM

BACKGROUND OF THE INVENTION

1. Field of the Invention

The present invention relates to an image pickup apparatus, a control method therefor, and a computer-readable storage medium storing a control program for implementing the method, and in particular, to exposure control during motion with high shutter speed.

2. Description of the Related Art

Conventionally, at the time of shooting a subject using an image pickup apparatus, luminance level is adjusted so as to control the brightness of the subject to a substantially constant value. In general, an image pickup apparatus adjusts luminance level by controlling exposure time using a diaphragm mechanism or an electronic shutter which adjust the amount of light from a taking lens.

Further, when a subject is dark, the gain of an electric signal, which is an output from an image pickup device, is controlled using an image pickup apparatus itself, an external amplifier, or the like to broaden the range in which the subject can be controlled to an appropriate luminance level.

In a case where exposure time is controlled using an electronic shutter, exposure time needs to be short when a subject is bright. In general, however, because exposure time controlled using an electronic shutter is an integral multiple of a horizontal synchronous signal period of an image pickup device, the closer the exposure time to the horizontal synchronous signal period, the greater the degree to which luminance changes with a one-step change in exposure time.

According to, for example, Japanese Patent Publication No. 3861711 or Japanese Laid-Open Patent Publication (Kokai) No. H09-55878, in order to suppress changes in luminance, a luminance level of a subject is adjusted by adjusting an amplification unit while minimizing shutter speed within such a range as not to exceed the luminance level of the subject.

However, according to Japanese Patent Publication No. 3861711 or Japanese Laid-Open Patent Publication (Kokai) No. H09-55878, a gain is always added according to a luminance of a subject, resulting in noise in an image itself.

SUMMARY OF THE INVENTION

The present invention provides an image pickup apparatus capable of suppressing changes in luminance during motion with high shutter speed while minimizing image degradation, a control method therefor, and a computer-readable storage medium storing a control program for implementing the method.

Accordingly, a first aspect of the present invention provides an image pickup apparatus comprising an image pickup device configured to accumulate electric charge corresponding to an amount of light incident on the image pickup device, an amplification unit configured to amplify a signal obtained as a result of accumulating electric charge in the image pickup apparatus, a control unit configured to control an electric charge accumulation time period in the image pickup device, and an adjustment unit configured to adjust an amplification factor for the amplification unit, wherein in a case where the control unit changes the electric charge accumulation time period while the image pickup device is repeatedly accumulating electric charge, the adjustment unit adjusts an amplification factor for the amplification unit in accordance with the amount of change in the electric charge accumulation time period, and after the amplification factor for the amplification unit is adjusted in accordance with the amount of change in the electric charge accumulation time period, the adjustment unit brings the amplification factor for the amplification unit close to an amplification factor before adjustment in steps.

Accordingly, a second aspect of the present invention provides a control method for an image pickup apparatus having an image pickup device that accumulates electric charge corresponding to an amount of light incident on the image pickup apparatus and an amplification unit that amplifies a signal obtained as a result of accumulating electric charge in the image pickup apparatus, comprising a control step of controlling an electric charge accumulation time period for accumulating the electric charge in the image pickup apparatus, and an adjustment step of adjusting an amplification factor for the amplification unit, wherein in a case where the electric charge accumulation time period is changed in the control step while the image pickup device is repeatedly accumulating electric charge, an amplification factor for the amplification unit is adjusted in the adjustment step in accordance with the amount of change in the electric charge accumulation time period, and after the amplification factor for the amplification unit in accordance with the amount of change in the electric charge accumulation time period is adjusted, the amplification factor for the amplification unit is brought close to an amplification factor before adjustment in steps in the adjustment step.

Accordingly, a third aspect of the present invention provides a non-transitory computer-readable storage medium storing a control program for causing a computer to implement a control method for an image pickup apparatus having an image pickup device that accumulates electric charge corresponding to an amount of light incident on the image pickup apparatus and an amplification unit that amplifies a signal obtained as a result of accumulating electric charge in the image pickup apparatus, the control method comprising a control step of controlling an electric charge accumulation time period for accumulating the electric charge in the image pickup apparatus, and an adjustment step of adjusting an amplification factor for the amplification unit, wherein in a case where the electric charge accumulation time period is changed in the control step while the image pickup device is repeatedly accumulating electric charge, an amplification factor for the amplification unit is adjusted in the adjustment step in accordance with the amount of change in the electric charge accumulation time period, and after the amplification factor for the amplification unit in accordance with the amount of change in the electric charge accumulation time period is adjusted, the amplification factor for the amplification unit is brought close to an amplification factor before adjustment in steps in the adjustment step.

According to the present invention, changes in luminance during motion with high shutter speed can be suppressed while image degradation is minimized.

Further features of the present invention will become apparent from the following description of exemplary embodiments (with reference to the attached drawings).

BRIEF DESCRIPTION OF THE DRAWINGS

FIGS. 4A, 4B, and 4C are diagrams useful in concretely explaining the exposure adjustment process explained with reference to FIG. 3, in which FIG. 4A shows the luminance of a subject, FIG. 4B shows shutter speed, and FIG. 4C shows gain.

DESCRIPTION OF THE EMBODIMENTS

An exemplary image pickup apparatus will now be described in detail with reference to the drawings.

Figure 1:
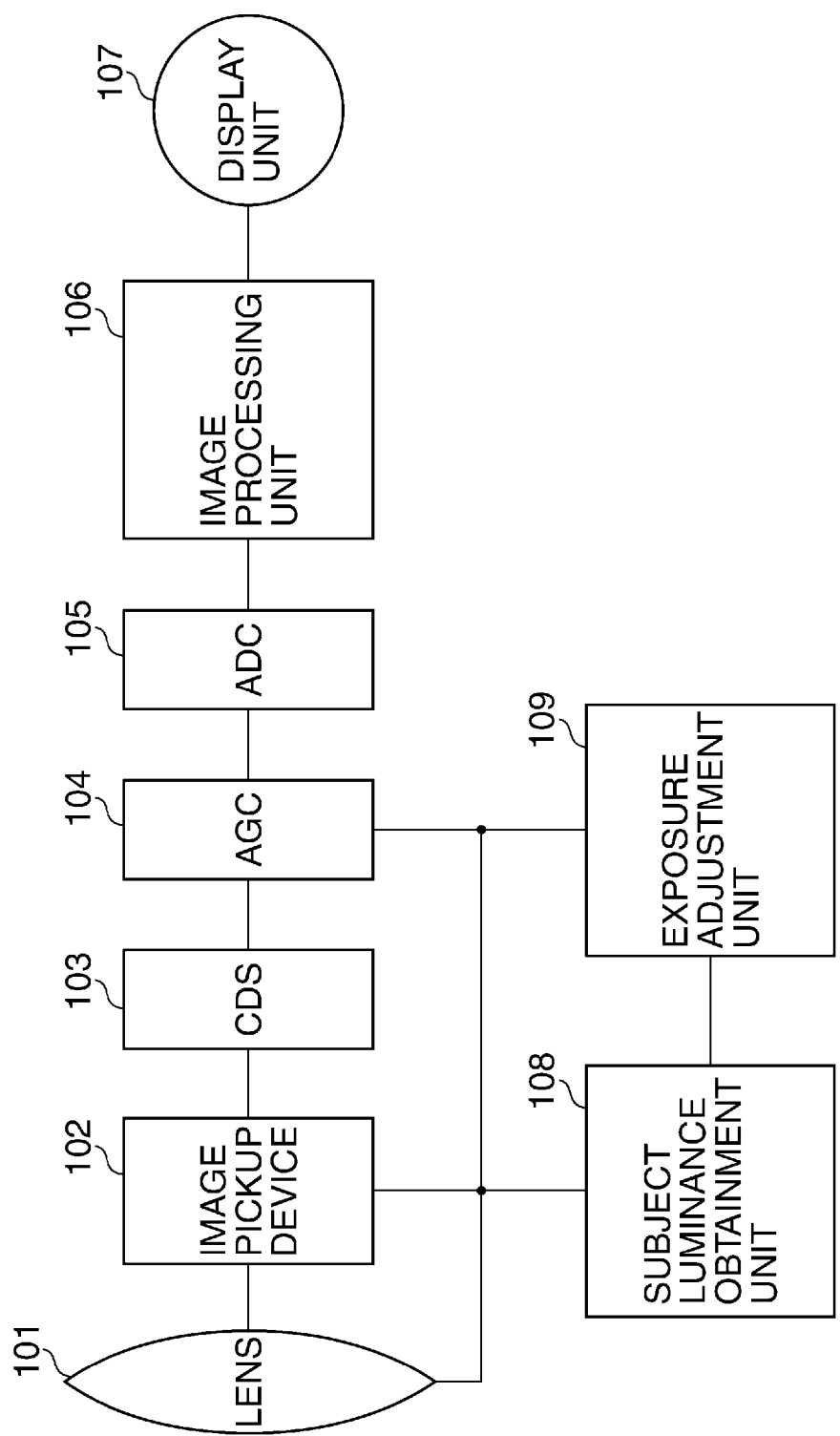
FIG. 1 is a block diagram schematically showing an arrangement of an exemplary image pickup apparatus according to a first embodiment.

FIG. 1 is a block diagram schematically showing an arrangement of an exemplary image pickup apparatus according to a first embodiment.

Referring to FIG. 1, the image pickup apparatus has an image pickup device 102 such as a CCD or CMOS sensor. A subject image (optical image) is formed on the image pickup device 102 via a lens 101 comprised of several lenses. Then, the image pickup device 102 accumulates electric charges in accordance with an amount of light incident on the image pickup device 102 and outputs, as an output signal, an electric signal (analog signal) corresponding to the optical image. This electric signal (output signal) is subjected to processing by a correlated double sampling circuit (CDS) 103. It should be noted that although not shown in the figure, a diaphragm and a shutter are disposed at the lens 101 or between the lens 101 and the image pickup device 102.

An output from the CDS 103 (referred to as the CDS processed signal) is supplied to an automatic gain control circuit (AGC) 104, which in turn subjects the CDS processed signal to amplification processing as will be described later to obtain an amplified signal. This amplified signal is converted into a digital signal (image signal) by an analog-to-digital converter (ADC) 105.

The image signal output from the ADC 105 is supplied to an image processing unit 106 which has a digital signal processor (DSP) and others. The image processing unit 106 subjects the image signal to predetermined image processing to obtain image data. Then, an image corresponding to the image data is displayed on a display unit 107 which is, for example, liquid crystal or organic EL-based.

The image pickup device 102 has a plurality of pixels (also referred to as elements) arrayed in a matrix, so that shutter speed can be adjusted in stages. A subject luminance obtainment unit 108 obtains luminance values in respective predetermined regions of the image pickup device 102. The subject luminance obtainment unit 108 supplies the luminance values in the respective predetermined regions to an exposure adjustment unit 109. Based on the luminance values in the respective predetermined regions, the exposure adjustment unit 109 adjusts exposure by controlling aperture, shutter speed, and gain for the AGC 104.

Figure 2:
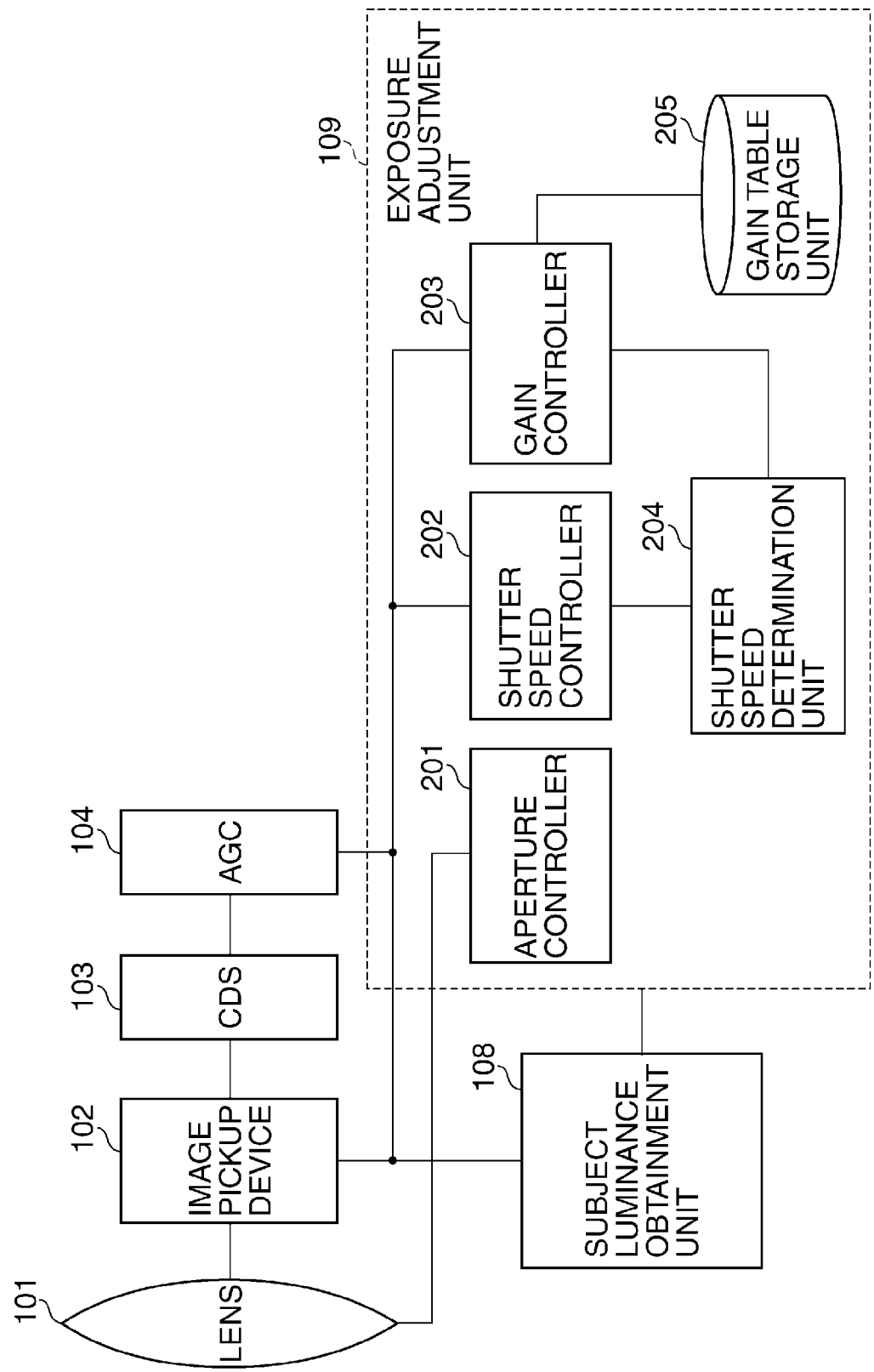
FIG. 2 is a block diagram useful in explaining an exemplary arrangement of an exposure adjustment unit appearing in FIG. 1.

FIG. 2 is a block diagram useful in explaining an exemplary arrangement of the exposure adjustment unit 109 appearing in FIG. 1. It should be noted that the ADC 105, the image processing unit 106, and the display unit 107 appearing in FIG. 1 are omitted from FIG. 2.

The exposure adjustment unit 109 has an aperture controller 201, a shutter speed controller 202, a gain controller 203, a shutter speed determination unit 204, and a gain table storage unit 05. Upon receiving a luminance value from the subject luminance obtainment unit 108, the exposure adjustment unit 109 adjusts aperture, shutter speed, and gain according to the luminance value.

The aperture controller 201 drivingly controls diaphragm of the lens 101 and provides control to open and close the diaphragm according to a luminance value, thus adjusting the amount of light incident on the image pickup device 102. The shutter speed controller 202 controls an accumulation time period, for which electric charge is accumulated in the image pickup device 102 (electric charge accumulation time period), according to a luminance value. The accumulation time period is, for example, a discrete value, which is an integral multiple of a horizontal synchronous signal period of the image pickup device 102. The gain controller 203 provides control to set a gain value (amplification factor) for the AGC 104 according to a luminance value.

The shutter speed determination unit 204 determines whether or not a shutter speed set by the shutter speed controller 202 is higher than a predetermined shutter speed (whether or not the accumulation time period is shorter than a predetermined time period). In the gain table storage unit 205, compensation gain values that correspond to changes in luminance occurring with changes in shutter speed and are intended to compensate for the changes in luminance are stored.

Figure 3:
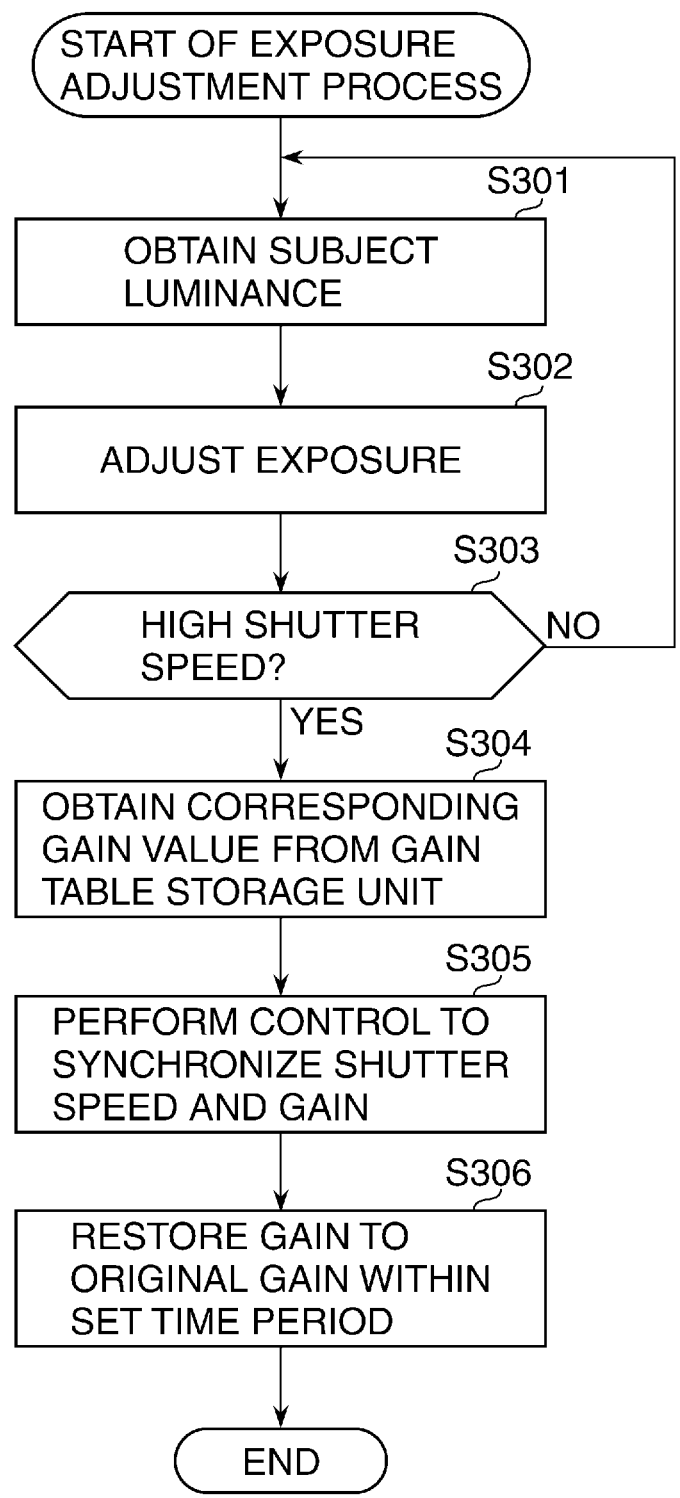
FIG. 3 is a flowchart useful in explaining an exposure adjustment process carried out by the exposure adjustment unit appearing in FIG. 2.

FIG. 3 is a flowchart useful in explaining an exposure adjustment process carried out by the exposure adjustment unit 109 appearing in FIG. 2.

Upon obtaining a subject luminance (luminance value) in the image pickup device 102 from the subject luminance obtainment unit 108 (step S301), the aperture controller 201, the shutter speed controller 202, and the gain controller 203 provide aperture control, shutter speed control, and gain control, respectively, to adjust exposure so that the luminance of an image can be equal to a predetermined value (step S302). On this occasion, the aperture controller 201, the shutter speed controller 202, and the gain controller 203 obtain an average value of luminances of the entire image and a peak value of the luminances according to the subject luminance (luminance value in each of the predetermined regions). Moreover, as will be described later, the gain controller 203 restores the gain for the AGC 104 that has been adjusted using the compensation gain to the original gain within a time period set in advance. For this reason, in the adjustment of exposure in the step S302, shutter speed is adjusted so that a signal level amplified using the gain for the AGC 104 before adjustment using the compensation gain becomes a predetermined level.

Then, the shutter speed determination unit 204 determines whether or not a shutter speed set by the shutter speed controller 202 (set shutter speed) is higher than a predetermined shutter speed (high-speed shutter) (step S303). When it is determined that the set shutter speed is not higher than the predetermined shutter speed (NO in the step S303), the exposure adjustment unit 109 returns to the process in the step S301.

When it is determined that the set shutter speed is higher than the predetermined shutter speed (YES in the step S303), the gain controller 203 refers to the gain table storage unit 205 and obtains a compensation gain value for the set shutter speed from the gain table storage unit 205 (step S304).

Here, the compensation gain value stored in the gain table storage unit 205 is, for example, a gain value that compensates for a change in luminance occurring when shutter speed has changed by one step. Specifically, when shutter speed is M times greater than the horizontal synchronous signal period, the compensation gain value stored in the gain table storage unit 205 is a gain value that compensates for a change in luminance occurring when shutter speed has become (M+1) times or (M−1) times greater than the horizontal synchronous signal period.

Further, the predetermined shutter speed is a shutter speed in a case where a change in luminance occurring when shutter speed has changed from M times greater than the horizontal synchronous signal period to (M+1) times greater than the horizontal synchronous signal period or when shutter speed has changed from M times greater than the horizontal synchronous signal period to (M−1) times greater than the horizontal synchronous signal period is not less than about 0.15 EV. However, the predetermined shutter speed is not limited to a shutter speed in the case where a change in luminance is not less than about 0.15 EV, but may be arbitrarily set.

Next, the gain controller 203 adjusts gain for the AGC 104 according to the compensation gain value. On this occasion, the shutter speed determination unit 204 supplies a timing synchronization signal to the shutter speed controller 202 and the gain controller 203. Then, the shutter speed controller 202 and the gain controller 203 provide control to synchronize shutter speed and gain using the timing synchronization signal so that no change in luminance occurs in image data (step S305). Namely, gain is adjusted here in synchronization with a change in shutter speed. In other words, when an accumulation time period is changed while the image pickup apparatus are repeatedly charging electric charges, an amplification factor for the AGC 104 is adjusted in accordance with an amount of change in the accumulation time period.

Then, the gain controller 203 restores the gain for the AGC 104, which has been adjusted using the compensation gain value, to the original gain within a time period set in advance (step S306) and terminates the exposure adjustment process.

Figure 4:
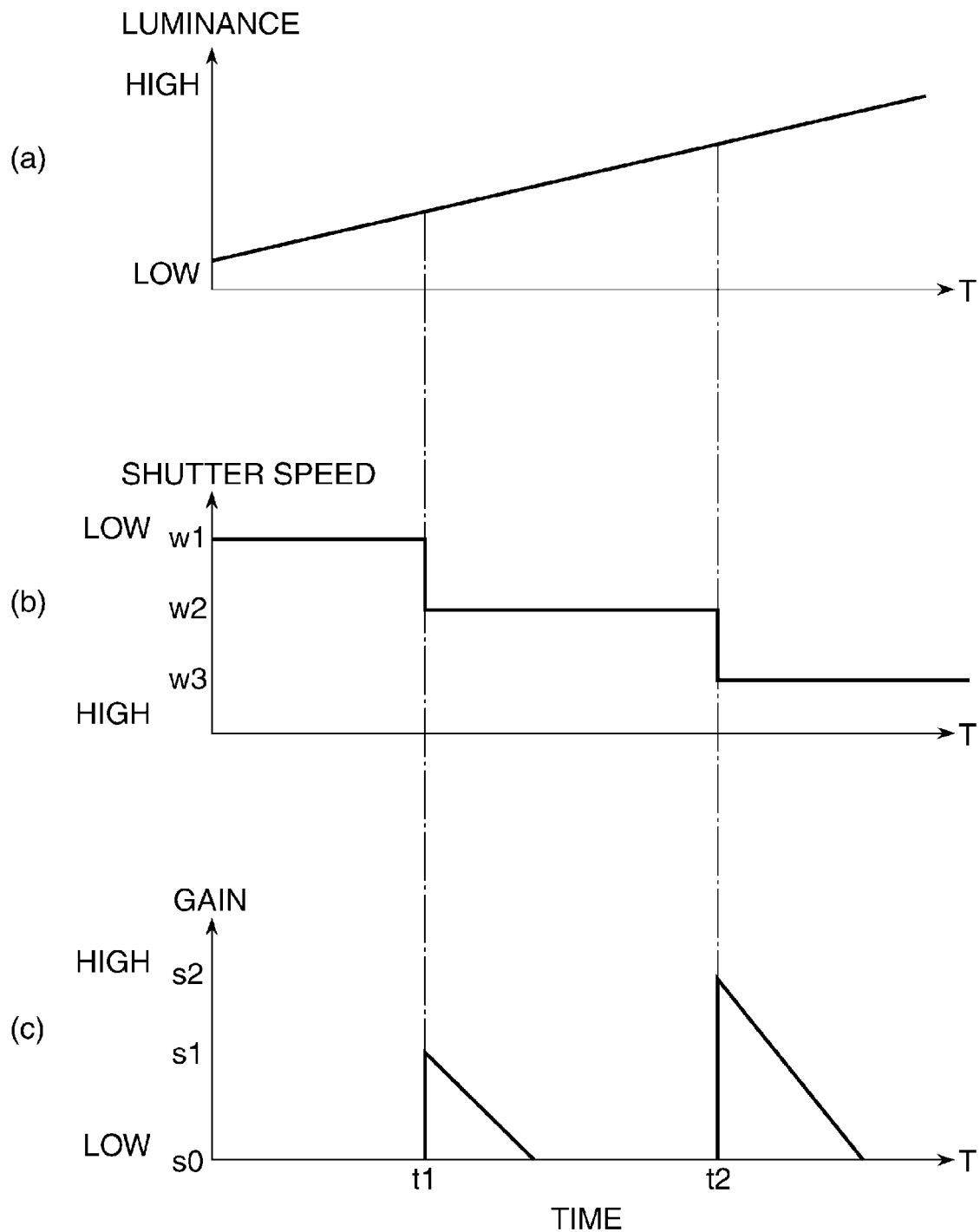

FIGS. 4A, 4B, and 4C are diagrams useful in concretely explaining the exposure adjustment process explained with reference to FIG. 3, in which FIG. 4A shows the luminance of a subject, FIG. 4B shows shutter speed, and FIG. 4C shows gain.

Referring to FIGS. 4A, 4B, and 4C, the horizontal axes designate time, and the vertical axes designate luminance, shutter speed, and gain, respectively. Here, as shown in FIG. 4A, the luminance of a subject increases as time passes.

When the luminance of a subject increases as time passes, an initial shutter speed w1 reaches a shutter speed w2 at a time t1 as shown in FIG. 4B. Then, shutter speed reaches a shutter speed w3 at a time t3. It should be noted that w1>w2>w3, and shutter speed increases as time passes. Here, the shutter speed w1 is a shutter speed that is determined to be higher than the predetermined shutter speed by the shutter speed determination unit 204.

On the other hand, gain is a gain s0 at first and reaches a gain s1 at the time t1 in response to a change in the luminance of the subject, and the gain s1 gradually decreases to the gain s0 within a time period set in advance. Then, at a time t2, gain reaches a gain s2, and the gain s2 gradually decreases to the gain s0 within a time period set in advance. It should be noted that s0<s1<s2.

Namely, when shutter speed changes from w1 to w2 at the time t1 while the luminance of the subject gradually increases, the gain that compensates for the change in luminance caused by the change in shutter speed (that compensates for an amount of changes in a signal obtained as a result of electric charge accumulation in the image pickup device 102 performed in accordance with a change in accumulation time period in the image pickup device 102) is added. Here, the change in luminance occurring when shutter speed changes from w1 to w2 is equal to the change in luminance occurring when gain changes from s0 to s1.

Then, after gain changes from s0 to s1 at the time t1, gain gradually decreases again to the gain s0 within the time period set in advance. On this occasion, in order to make changes in luminance less conspicuous, gain is gradually decreased from s1 to s0 while the rate of change in luminance is kept in check within a time period Δt set in advance.

Likewise, at the time t2 as well, the gain s2 that compensates for the change in luminance caused by the change in shutter speed is added. After the gain s2 is added, gain gradually decreases from s2 to s0 within the time period Δt set in advance.

In the example shown in the figures, when gain is to be restored in stages from the adjusted gain s1 or s2 to the original gain (reference gain) s0, gain is gradually and linearly decreases, but gain may be restored in a curved line as long as it is restored within the time period Δt set in advance. Namely, after the amplification factor for the AGC 104 is adjusted in accordance with the amount of change in the accumulation time period in the image pickup device 102, the amplification factor for the AGC 104 may be brought close to the amplification factor before adjustment in steps.

It should be noted that the same process as in the example described above is carried out when the luminance of the subject decreases conversely to the case shown in FIG. 4A as time passes. On this occasion, there may arise a problem that, for example, gain temporarily becomes smaller than the original gain (reference gain), and color on the high-luminance side changes accordingly. For this reason, when gain becomes smaller than the reference gain, a process in which color on the high-luminance side is desaturated is carried out in synchronization with the change in gain. Namely, although not shown in the figure, when gain becomes smaller than the reference gain, the image processing unit 106 carries out a color saturation adjustment process in which it desaturates color on the high-luminance side (higher luminances than a predetermined luminance) in synchronization with the change in gain.

Thus, according to the first embodiment, when shutter speed changes in response to a change in the luminance of a subject to become higher than a predetermined shutter speed, a gain corresponding to a change in luminance caused by the change in shutter speed is temporarily added to the AGC 104, and hence changes in luminance during motion with high shutter speed can be suppressed while image degradation is minimized.

Next, a description will be given of an exemplary image pickup apparatus according to a second embodiment.

Figure 5:
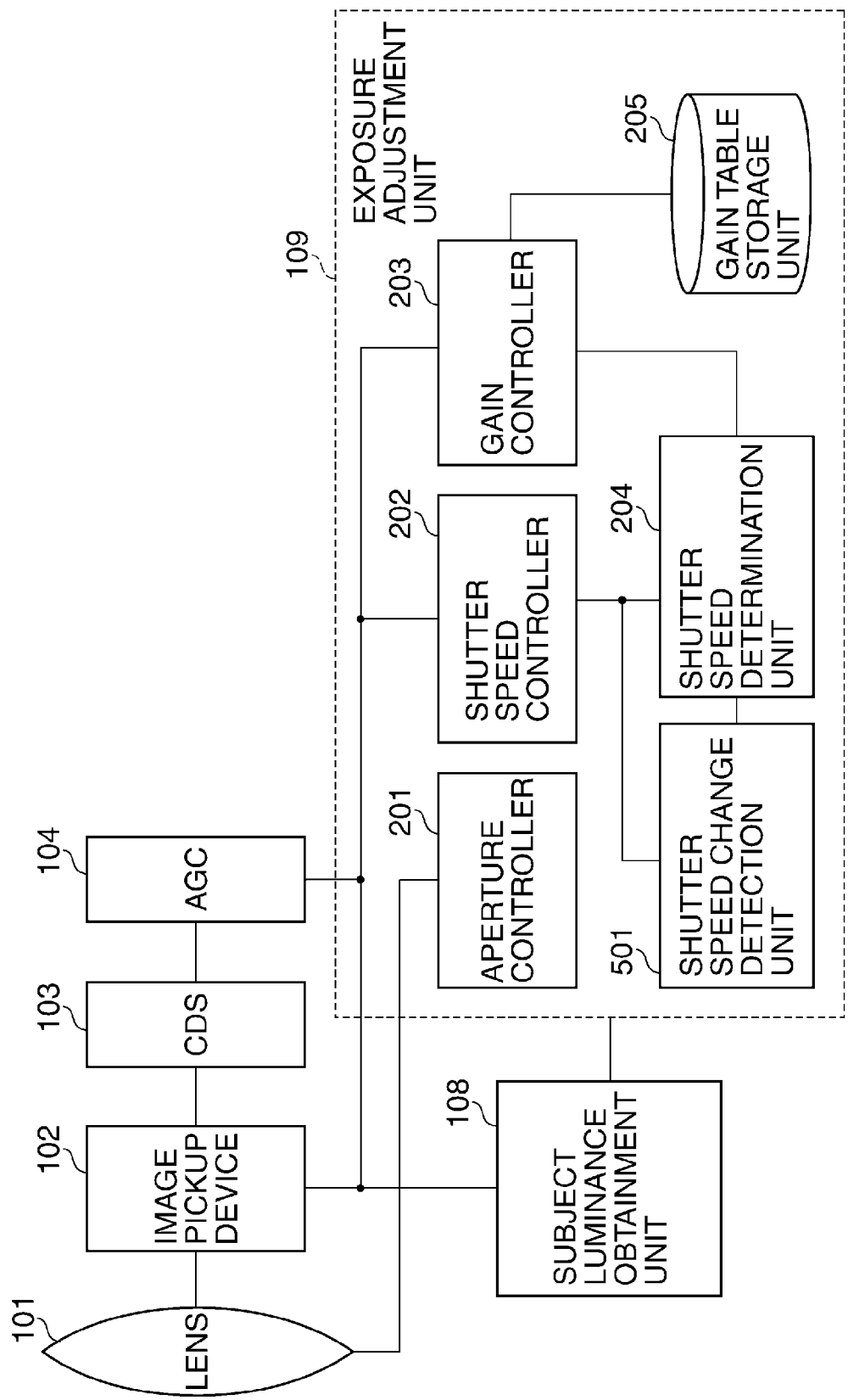
FIG. 5 is a block diagram schematically showing an arrangement of an exemplary image pickup apparatus according to a second embodiment.

FIG. 5 is a block diagram schematically showing an arrangement of an exemplary image pickup apparatus according to the second embodiment. It should be noted that in FIG. 5, the same component elements as those shown in FIG. 2 are designated by the same reference numerals, and description thereof is omitted.

Referring to FIG. 5, the exposure adjustment unit 109 further has a shutter speed change detection unit 501. This shutter speed change detection unit 501 detects, as a shutter speed difference, a difference between a shutter speed one frame before and a present shutter speed. Then, the shutter speed determination unit 204 carries out a determination process, to be described later, according to the shutter speed difference.

Figure 6:
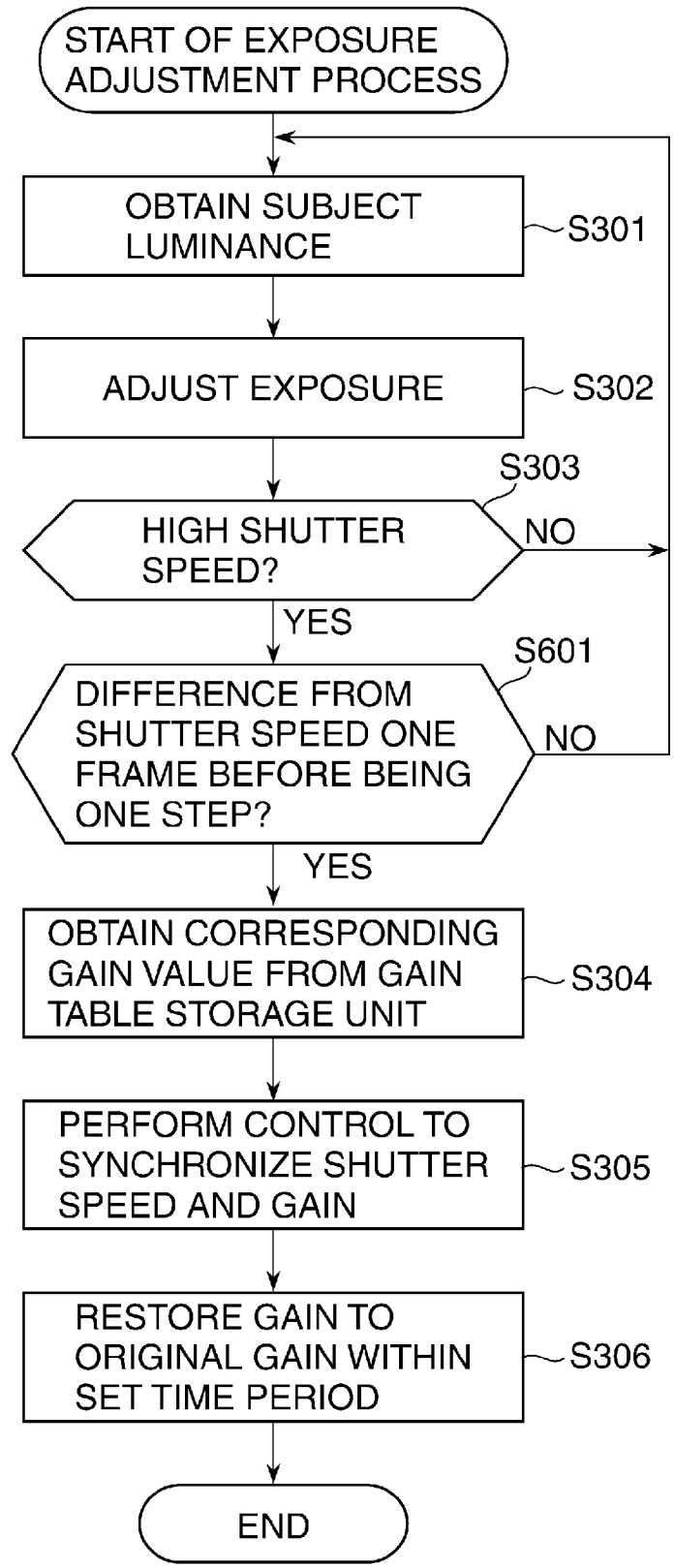
FIG. 6 is a flowchart useful in explaining an exposure adjustment process carried out by an exposure adjustment unit appearing in FIG. 5.

FIG. 6 is a flowchart useful in explaining an exposure adjustment process carried out by the exposure adjustment unit 109 appearing in FIG. 5. It should be noted that in FIG. 6, the same steps as those in the flowchart of FIG. 3 are designated by the same reference numerals, and description thereof is omitted.

When it is determined in the step S303 that shutter speed is higher than the predetermined shutter speed, the shutter speed determination unit 204 determines whether or not a shutter speed difference is one step (step S601). Namely, the shutter speed determination unit 204 compares a shutter speed one frame before and a present shutter speed with each other and determines whether or not a difference between them is one step.

Here, when the shutter speed one frame before is M times greater than the horizontal synchronous signal period, and the present shutter speed is not (M+1) times greater or (M−1) times greater than the horizontal synchronous signal period (NO in the step S601), the shutter speed determination unit 204 determines that shutter speed has changed two steps or more (two stages or more).

In this case, the shutter speed determination unit 204 determines that luminance has greatly changed, and as a result, shutter speed will greatly change due to control by the shutter speed controller 202. On this occasion, the exposure controller 109 returns to the process in the step S301.

On the other hand, when it is determined that the present shutter speed is (M+1) times greater or (M−1) times greater than the horizontal synchronous signal period (YES in the step S601), the gain controller 203 refers to the gain table storage unit 205 and obtains the compensation gain value corresponding to the set shutter speed from the gain table storage unit 205 in the step S304 as described above.

Thus, in the second embodiment, whether or not to adjust gain using the compensation gain value is determined according to a shutter speed difference. For this reason, when a change in luminance is greater than a predetermined change (shutter speed has changed by predetermined steps or more), suppression of changes in luminance is not performed (control of gain in synchronization with a change in shutter speed is not performed). Therefore, gain adjustment is not performed unnecessarily, and image degradation can be reduced to a greater degree than in the first embodiment.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-016617 filed Jan. 30, 2012, which is hereby incorporated by reference herein in its entirety.

What is claimed is:

1. An image pickup apparatus comprising:
an image pickup device configured to accumulate electric charge corresponding to an amount of light incident on said image pickup device;
an amplification unit configured to amplify a signal obtained as a result of accumulating electric charge in said image pickup apparatus;
a control unit configured to control an electric charge accumulation time period in said image pickup device; and
an adjustment unit configured to adjust an amplification factor for said amplification unit,
wherein in a case where said control unit changes the electric charge accumulation time period from an electric charge accumulation time period which is shorter than a predetermined time period to another electric charge accumulation time period which is shorter than the predetermined time period while said image pickup device is repeatedly accumulating electric charge, said adjustment unit adjusts an amplification factor for said amplification unit in accordance with the amount of change in the electric charge accumulation time period, and after the amplification factor for said amplification unit is adjusted in accordance with the amount of change in the electric charge accumulation time period, said adjustment unit gradually brings the amplification factor for said amplification unit close to an amplification factor, within a predetermined adjustment time period, before adjustment in steps, and
wherein in a case where said control unit changes the electric charge accumulation time period from an electric charge accumulation time period which is longer than the predetermined time period to another electric charge accumulation time period which is longer than the predetermined time period while said image pickup device is repeatedly accumulating electric charge, said adjustment unit does not adjust the amplification factor for said amplification unit in accordance with the amount of change in the electric charge accumulation time period.

2. An image pickup apparatus as claimed in claim 1, wherein before a predetermined time period elapses after the amplification factor for said amplification unit is adjusted in accordance with the amount of change in the electric charge accumulation time period, said adjustment unit restores the amplification factor for said amplification unit to the amplification factor before adjustment.

3. An image pickup apparatus as claimed in claim 1, wherein when said control unit changes the electric charge accumulation time period, said adjustment unit adjusts the amplification factor for said amplification unit so that an amount of change in the signal accompanying the change in the electric charge accumulation time period is compensated for.

4. An image pickup apparatus as claimed in claim 1, wherein in a case where the amount of change in the electric charge accumulation time period is not less than a first predetermined value, said adjustment unit adjusts the amplification factor for said amplification unit when said control unit changes the electric charge accumulation time period.

5. An image pickup apparatus according to claim 4, wherein in a case where the amount of change in the electric charge accumulation time period is not less than a second predetermined value, which is greater than the first predetermined value, said adjustment unit does not adjust the amplification factor for said amplification unit even if said control changes the electric charge accumulation time period.

6. An image pickup apparatus according to claim 1, wherein said control unit changes the electric charge accumulation time period so that a level of the signal that has been amplified with an amplification factor unadjusted in accordance with the amount of change in the electric charge accumulation time period becomes a desired level.

7. An image pickup apparatus as claimed in claim 1, wherein when said control unit changes the electric charge accumulation time period, said adjustment unit adjusts the amplification factor for said amplification unit to an signal that has been obtained as a result of accumulating electric charge in said image pickup apparatus by changing the electric charge accumulation time period in accordance with the amount of change in the electric charge accumulation time period.

8. A control method for an image pickup apparatus having an image pickup device that accumulates electric charge corresponding to an amount of light incident on the image pickup apparatus and an amplification unit that amplifies a signal obtained as a result of accumulating electric charge in the image pickup apparatus, comprising:

a control step of controlling an electric charge accumulation time period for accumulating the electric charge in the image pickup apparatus; and an adjustment step of adjusting an amplification factor for the amplification unit, wherein in a case where the electric charge accumulation time period is changed in said control step from an electric charge accumulation time period which is shorter than a predetermined time period to another electric charge accumulation time period which is shorter than the predetermined time period while said image pickup device is repeatedly accumulating electric charge, an amplification factor for said amplification unit is adjusted in said adjustment step in accordance with the amount of change in the electric charge accumulation time period , and after the amplification factor for said amplification unit in accordance with the amount of change in the electric charge accumulation time period is adjusted, the amplification factor for said amplification unit is gradually brought close to an amplification factor, within a predetermined adjustment time period, before adjustment in steps in said adjustment step, and wherein in a case where said control step changes the electric charge accumulation time period from an electric charge accumulation time period which is longer than the predetermined time period to another electric charge accumulation time period which is longer than the predetermined time period while said image pickup device is repeatedly accumulating electric charge, said adjustment step does not adjust the amplification factor for said amplification unit in accordance with the amount of change in the electric charge accumulation time period.

9. A non-transitory computer-readable storage medium storing a control program for causing a computer to implement a control method for an image pickup apparatus having an image pickup device that accumulates electric charge corresponding to an amount of light incident on the image pickup apparatus and an amplification unit that amplifies a signal obtained as a result of accumulating electric charge in the image pickup apparatus, the control method comprising:

a control step of controlling an electric charge accumulation time period for accumulating the electric charge in the image pickup apparatus; and an adjustment step of adjusting an amplification factor for the amplification unit, wherein in a case where the electric charge accumulation time period is changed in said control step from an electric charge accumulation time period which is shorter than a predetermined time period to another electric charge accumulation time period which is shorter than the predetermined time period while said image pickup device is repeatedly accumulating electric charge, an amplification factor for said amplification unit is adjusted in said adjustment step in accordance with the amount of change in the electric charge accumulation time period, and after the amplification factor for said amplification unit in accordance with the amount of change in the electric charge accumulation time period is adjusted, the amplification factor for said amplification unit is gradually brought close to an amplification factor, within a predetermined adjustment time period, before adjustment in steps in said adjustment step, and wherein in a case where said control step changes the electric charge accumulation time period from an electric charge accumulation time period which is longer than the predetermined time period to another electric charge accumulation time period which is longer than the predetermined time period while said image pickup device is repeatedly accumulating electric charge, said adjustment step does not adjust the amplification factor for said amplification unit in accordance with the amount of change in the electric charge accumulation time period.

\* \* \* \* \*